United States Patent
Mukhanov et al.

(10) Patent No.: US 9,627,045 B1
(45) Date of Patent: Apr. 18, 2017

(54) SUPERCONDUCTING DEVICES WITH FERROMAGNETIC BARRIER JUNCTIONS

(71) Applicant: Hypres Inc., Elmsford, NY (US)

(72) Inventors: Oleg A. Mukhanov, Putnam Valley, NY (US); Alan M. Kadin, Princeton Junction, NJ (US); Ivan P. Nevirkovets, Evanston, IL (US); Igor V. Vernik, Yorktown Heights, NY (US)

(73) Assignee: Hypres, Inc., Elmsford, NY (US)

( * ) Notice: Subject to any disclaimer, the term of this patent is extended or adjusted under 35 U.S.C. 154(b) by 230 days.

(21) Appl. No.: 14/636,632

(22) Filed: Mar. 3, 2015

Related U.S. Application Data

(63) Continuation of application No. 13/349,641, filed on Jan. 13, 2012, now Pat. No. 8,971,977.

(60) Provisional application No. 61/433,519, filed on Jan. 17, 2011.

(51) Int. Cl.
G11C 11/44 (2006.01)
H01L 39/02 (2006.01)
H01L 39/22 (2006.01)

(52) U.S. Cl.
CPC ............ *G11C 11/44* (2013.01); *H01L 39/025* (2013.01); *H01L 39/223* (2013.01)

(58) Field of Classification Search
CPC ...... H01L 39/22; H01L 39/223–39/228; H01L 39/2493; H01L 39/2496; G11C 11/00; G11C 11/44; G11C 11/02; G11C 11/15; G11C 11/16; G11C 11/161; G11C 11/1659
See application file for complete search history.

(56) References Cited

U.S. PATENT DOCUMENTS

| | | |
|---|---|---|
| 4,023,290 A | 5/1977 | Josephson |
| 4,601,015 A | 7/1986 | Ishida |
| 5,276,639 A | 1/1994 | Inoue |
| 5,930,165 A | 7/1999 | Johnson et al. |
| 5,942,765 A | 8/1999 | Miyahara et al. |

(Continued)

OTHER PUBLICATIONS

V.V. Bolginov, et al., "Reentrant temperature dependence of critical current in superconductor—ferromagnet—superconductor junctions based on PdFe alloys", arXiv:07092495v1 , (2007).

(Continued)

*Primary Examiner* — Colleen Dunn
(74) *Attorney, Agent, or Firm* — Steven M. Hoffberg, Esq.; Ostrolenk Faber LLP

(57) ABSTRACT

A superconducting memory cell includes a magnetic Josephson junction (MJJ) with a ferromagnetic material, having at least two switchable states of magnetization. The binary state of the MJJ manifests itself as a pulse appearing, or not appearing, on the output. A superconducting memory includes an array of memory cells. Each memory cell includes a comparator with at least one MJJ. Selected X and Y-directional write lines in their combination are capable of switching the magnetization of the MJJ. A superconducting device includes a first and a second junction in a stacked configuration. The first junction has an insulating layer barrier, and the second junction has an insulating layer sandwiched in-between two ferromagnetic layers as barrier. An electrical signal inputted across the first junction is amplified across the second junction.

20 Claims, 11 Drawing Sheets

(56) References Cited

U.S. PATENT DOCUMENTS

| | | | |
|---|---|---|---|
| 6,226,160 | B1 | 5/2001 | Gallagher et al. |
| 6,229,154 | B1 | 5/2001 | Nojima et al. |
| 6,233,171 | B1 | 5/2001 | Youm et al. |
| 6,414,870 | B1 | 7/2002 | Johnson et al. |
| 6,538,297 | B2 | 3/2003 | Odagawa et al. |
| 6,605,822 | B1 | 8/2003 | Blais et al. |
| 6,670,630 | B2 | 12/2003 | Blais et al. |
| 6,769,170 | B1 | 8/2004 | Shimazawa et al. |
| 6,812,039 | B1 | 11/2004 | Kohlstedt et al. |
| 6,818,549 | B2 | 11/2004 | Fricke et al. |
| 7,054,120 | B2 | 5/2006 | Nakatani et al. |
| 7,159,303 | B2 | 1/2007 | Nakatani et al. |
| 7,292,417 | B2 | 11/2007 | Nakatani et al. |
| 7,332,738 | B2 | 2/2008 | Blais et al. |
| 7,443,719 | B2 * | 10/2008 | Kirichenko ............. G11C 8/10 365/160 |
| 7,533,068 | B2 | 5/2009 | Maassen van den Brink et al. |
| 7,535,069 | B2 | 5/2009 | Abraham et al. |
| 7,624,088 | B2 | 11/2009 | Johnson et al. |
| 7,969,805 | B2 | 6/2011 | Thom et al. |
| 8,008,942 | B2 | 8/2011 | van den Brink et al. |
| 8,200,304 | B2 * | 6/2012 | Maeda ................ G01R 33/035 257/33 |
| 8,208,288 | B2 | 6/2012 | Bulzacchelli et al. |
| 8,283,943 | B2 | 10/2012 | van den Brink et al. |
| 8,406,834 | B2 * | 3/2013 | Kirichenko ........... H01L 39/223 505/190 |
| 8,456,903 | B2 | 6/2013 | Tang et al. |
| 8,686,751 | B2 | 4/2014 | van den Brink et al. |
| 8,971,977 | B2 | 3/2015 | Mukhanov et al. |
| 9,013,916 | B2 | 4/2015 | Naaman et al. |
| 9,069,928 | B2 | 6/2015 | van den Brink et al. |
| 2003/0173498 | A1 | 9/2003 | Blais et al. |
| 2003/0173997 | A1 | 9/2003 | Blais et al. |
| 2006/0225165 | A1 | 10/2006 | Maassen van den Brink et al. |
| 2007/0174227 | A1 | 7/2007 | Johnson et al. |
| 2007/0194225 | A1 | 8/2007 | Zorn |
| 2009/0167342 | A1 | 7/2009 | van den Brink et al. |
| 2009/0244958 | A1 | 10/2009 | Bulzacchelli et al. |
| 2011/0267878 | A1 * | 11/2011 | Herr ........................ G11C 11/44 365/171 |
| 2011/0298489 | A1 | 12/2011 | van den Brink et al. |
| 2012/0120719 | A1 | 5/2012 | Worledge |
| 2012/0302446 | A1 | 11/2012 | Ryazanov et al. |
| 2013/0007087 | A1 | 1/2013 | van den Brink et al. |
| 2014/0229705 | A1 | 8/2014 | van den Brink et al. |
| 2015/0032994 | A1 | 1/2015 | Chudak et al. |
| 2015/0332164 | A1 | 11/2015 | Maassen van den Brink et al. |

OTHER PUBLICATIONS

I. P. Nevirkovets "A superconducting transistorlike device having good input-output isolation" Appl. Phys. Lett. 95, 052505, (2009).
I. P. Nevirkovets, et al., "Multi-Terminal Superconducting Nonequilibrium Device With a Ferromagnetic Screen" IEEE Trans. Appl. Supercond., vol. 21, No. 3, p. 721-723, (2011).
A. K. Feofanov, et al., "Implementation of superconductor/ferromagnet/superconductor-shifters in superconducting digital and quantum circuits", Nature Physics, vol. 6, p. 593-597 (2010).
R. Held, et al., "Superconducting memory based on ferromagnetism", Appl. Phys. Lett. 89, 163509, (2006).
A. F. Kirichenko, et al., "Pipelined DC-Powered SFQ RAM", IEEE Trans. Appl. Supercond., vol. 11, No. 1, p. 537-540, (2001).
K. Ohnishi, et al, "Nonlocal injection of spin current into a superconducting Nb wire", Appl. Phys. Lett. 96, 192509, (2010).
P. F. Yuh et al., "One-junction superconducting memory cell with column sense", IEEE Trans. Appl. Supercond., vol. 5, p. 3459 (1995).
S. V. Polonsky, et al., "Rapid Single Flux Quantum Random Access Memory", IEEE Trans. Appl. Supercond., vol. 5, p. 3000 (1995).
O. Mukhanov, "Energy efficient SFQ technology", IEEE Trans. Appl. Supercond., vol. 21, pp. 760-769, (2011).
Buzdin, A. I., and M. Yu Kupriyanov. "Josephson junction with a ferromagnetic layer." JETP Lett 53.6 (1991): 321.
Weides, M., et al. "0-π Josephson tunnel junctions with ferromagnetic barrier." Physical review letters 97.24 (2006): 247001.
Khaire, Trupti S., et al. "Observation of spin-triplet superconductivity in Co-based Josephson junctions." Physical review letters 104.13 (2010): 137002.
Weides, M., K. Tillmann, and H. Kohlstedt. "Fabrication of high quality ferromagnetic Josephson junctions." Physica C: Superconductivity and its applications 437 (2006): 349-352.
Sprungmann, D., et al. "Evidence for triplet superconductivity in Josephson junctions with barriers of the ferromagnetic Heusler alloy Cu 2 MnAl." Physical Review B 82.6 (2010): 060505.
Eschrig, Matthias. "Spin-polarized supercurrents for spintronics." Phys. Today 64.1 (2011): 43.
Mancusi, D., et al. "Evaluation of the specific boundary resistance of superconducting/weakly ferromagnetic hybrids by critical temperature measurements." Journal of Applied Physics 110.11 (2011): 113904.
Frolov, Sergey Maksimovich. Current-phase relations of josephson junctions with ferromagnetic barriers. Diss. University of Illinois at Urbana-Champaign, 2005.
Beutner, Sven. Probing Quantum States of Josephson Junctions with Ferromagnetic Barriers by Microwaves. Diss. diploma thesis, TUM, 2006.
Wild, Georg Hermann. Josephson Junctions with Ferromagnetic Interlayer. Diss. Universität München, 2012.
Klose, C., et al. "Correlation between spin-flop transition and enhanced spin polarized supercurrents in ferromagnetic Josephson junctions." Accomplishments and Opportunities 1500 (2012): 28.
Buzdin, Alexander. "Superconductor-Ferromagnet Nanostructures." NanoSpain Conf. (2009).
Vedyayev, A. V., N. V. Ryzhanova, and N. G. Pugach. "The Influence of sd Scattering on the Josephson Current in SFS Sandwiches."
Radovic, Z., I. Petkovic, and N. Chtchelkatchev. "Resonant tunneling in short Josephson junctions."
Kupriyanov, M. Yu, et al. "Extraordinary magnetic field behavior of SIFS Josephson junctions with an inhomogeneous transparency of the FS interface", Pis'ma v ZhETF vol. 88., iss 1, pp. 50-53 (2008).
Kandelaki, Ervand. "Transport in Josephson Heterostructures and Numerical Applications of Bosonization for Fermionic Systems."
Pomorski, Krzysztof, and Przemyslaw Prokopow. "Towards the Determination of Properties of the Unconventional Josephson Junction Made by Putting Non-Superconducting Strip on the Top of Superconducting Strip." Electronic Journal of Theoretical Physics 7.23 (2010): 85-121.
Prischepa, S. L., C. Cirillo, C. Bell, V. N. Kushnir, J. Aarts, C. Attanasio, and M. Yu Kupriyanov. "Resistive transitions in Nb/Cu0.41Ni0.59/Nb trilayers", Pis'ma v ZhETF vol. 88, iss. 6, pp. 431-435 (1988).
Kitamura, Michihide. Shapiro Steps in BSCCO Intrinsic Josephson Junctions. INTECH Open Access Publisher, 2012.
Mai, Sebastian. "Charge transport in irradiated graphene and Josephson structures." (2013).
Ryazanov, V. V. "In: Series on NanoScience and Technology. vol."Fundamentals of Superconducting Nanoelectronics", Chapter 8. Springer. pp. 219-248 (2011). Physics and applications of superconducting phase inverters based on superconductor-ferromagnet-superconductor Josephson junctions."
Ustinov, A. V. "Implementation of superconductor/ferromagnet/superconductor π-shifters in superconducting digital and quantum circuits." (2010).
Prepelitsa, A., et al. "Nonuniform superconducting state in superconductor/ferromagnet nanoscale layered system." Moldavian Journal of the Physical Sciences 5 (2006): N1.
Peng, L., et al. "Ultrafast optical probes of dynamic behavior in La0.7Sr0.3MnO3/YBa2Cu3O7-σ/La0.7Sr0.3MnO3 heterostructure." Pis'ma v ZhETF vol. 99, iss. 1, pp. 30-34 (2014).
Aprili, Marco. "Nano-Structures Hybrides Supraconducteur-Ferromagnetique." Ecole Franco-Roumaine : Magnétisme des systémes nanoscopiques et structures hybrids, Brasov, 2003.

(56) References Cited

OTHER PUBLICATIONS

Khaydukov, Yu, et al. "Structural, magnetic and superconducting characterization of the CuNi/Nb bilayers of the S/F type using PNR and complementary techniques." Circa 2010.
Singh, Amritpal. Multi-layer magnetism and thermal stability in perpendicular magnetic tunnel junctions. Diss. The University of Alabama Tuscaloosa, 2014.
Tagirov L.R., et al, "Theory of Superconductor-Strong Ferromagnet Contacts." Magnetic Resonance in Solids. Electronic Journal 6 (2004): 200.
Anishchanka, Alexandra. Proximity Effects in Superconductor Ferromagnet Structures. Diss. 2008.
Stolle, Renke. Makroskopisches Quantenverhalten von Josephson Kontakten aus Hochtemperatur-Supraleitern. Diss. diploma thesis, TUM, 2006.
Heurich, Jan-Erik. Elektronischer Transport durch Einzelatom-und Einzelmolekülkontakte. Rhombos-Verlag, 2003.
Miao, Guoxing. "Spintronics Driven by Superconducting Proximity Effect." (2015).
Alharbi, Abdulaziz Aiyedh. "Fundamental magnetic properties at nanometer scale." Circa 2009.
Allen, Leslie H. "Nanocalorimetry Studies of Materials: Melting Point Depression and Magic Nanostructures." NNUN Abstracts. 2002.
Hoffman, Silas Eli. "Spin Torques in Magnetic and Superconducting Tunnel Junctions." (2012).
Blum, Yuval. Coherence Effects in SNS and SNFNS Structures. Diss. Tel Aviv University, 2003.
Bourges, Philippe. "24O 41." (2005).
Huertas Hernando, Daniel. Coherent Transport in Superconducting and Ferromagnetic Hybrid Systems. TU Delft, Delft University of Technology, 2002.
Gilded, Suzanne. Macroscopic quantum tunnelling effects in Josephson junctions. Diss. University of Birmingham, School of Physics and Astronomy, 2008.
Susanto, H. "Josephson Junctions with Phase Shifts, Stability Analysis of Fractal Fluxons." (2006).

* cited by examiner

Write Circuit

SUPERCONDUCTING DEVICES WITH FERROMAGNETIC BARRIER JUNCTIONS

CROSS REFERENCE TO A RELATED APPLICATION

The present application is a Continuation of U.S. patent application Ser. No. 13/349,641 filed Jan. 13, 2012, now U.S. Pat. No. 8,971,977, issued Mar. 3, 2015, which claims the benefit of priority from the provisional application Ser. No. 61/433,519, filed on Jan. 17, 2011, the entirety of which are expressly incorporated herein by reference.

BACKGROUND

Embodiments of the present invention relate to superconducting electronics. In particular, they relate to devices and circuits having superconducting junctions, which junctions contain a ferromagnetic material in their barriers.

BRIEF SUMMARY

A superconducting memory cell includes a magnetic Josephson junction (MJJ) having a barrier that includes a ferromagnetic material. The ferromagnetic material has at least two states of magnetization. The MJJ is so configured that in one of the states of its magnetization it is capable to generate a single flux quantum (SFQ) pulse. The binary state manifests itself as the SFQ pulse appearing, or not appearing, on the output of the memory cell.

A superconducting memory includes an array of memory cells. Each memory cell includes a comparator with at least one MJJ. Selected X and Y-directional write lines in their combination are capable of switching the magnetization of the MJJ at their intersection.

A superconducting device includes a first and a second junction in a stacked configuration. The first junction has an insulating layer barrier, and the second junction has an insulating layer sandwiched in-between two ferromagnetic layers as barrier. An electrical signal inputted across the first junction is amplified across the second junction.

BRIEF DESCRIPTION OF THE SEVERAL VIEWS OF THE DRAWINGS

These and other features of the present invention will become apparent from the accompanying detailed description and drawings, wherein.

DETAILED DESCRIPTION

Superconducting digital electronics typically is based on the motion of a magnetic single flux quantum (SFQ) pulse with integrated voltage $\Phi_0 = h/2e = 2$ mV-ps=2 mA-pH. It is well known that this same quantity also provides the basis for non-volatile storage in memory cells with stored magnetic flux $\Phi = LI \sim \Phi_0$, where L is the inductance of a superconducting loop, and I is the lossless current around the loop. This loop may also comprise one or more Josephson junctions, provided that the current I is less than the critical current Ic of the junction(s).

A Josephson junction (JJ) comprises two superconducting layers with a thin insulating or normal-metallic layer between them (SIS or SNS). For example, this may be Nb/Al/AlOx/Nb, where the Al is sufficiently thin to be induced into the superconducting state, for circuits that are designed to operate at ~5° K or below. It is known in the art that a magnetic field applied in the plane of the JJ will modulate the critical current Ic according to a sinc function dependence: $(|\sin(x)/x|)$, where $x=\pi\Phi/\Phi_0$ and $\Phi$ is the magnetic flux inside the junction.

A Josephson junction is a 2-terminal device, which when biased above its critical current Ic, can generate a time-series of SFQ pulses. The Ic of a given JJ is effectively a constant. Although Ic varies with temperature, thermal switching of Ic is generally not useful for fast electronics. In comparison, a switchable MJJ has an Ic that may be tuned over a range of values. Because the barrier of an MJJ contains a ferromagnetic material, which being a permanent magnet material has hysteresis, the stable magnetic flux in the junction may have (at least) two different values. These correspond to two different values of the critical current, Ic, and one may repeatedly switch between them. The non-volatile aspect, namely that magnetization stays on after the stimulation has ceased, makes this switchable MJJ useful as a memory element. The term "ferromagnetic material" is being used in this disclosure in its broadest sense, namely, meaning that a state of magnetization of the material remains even after any external stimulus has been terminated, and the magnetization has a hysteretic behavior. By way of example, without intent of limiting, ferromagnetic materials include Fe, Co, Ni, some rare earth elements, and alloys of all of these.

Figure 1A:
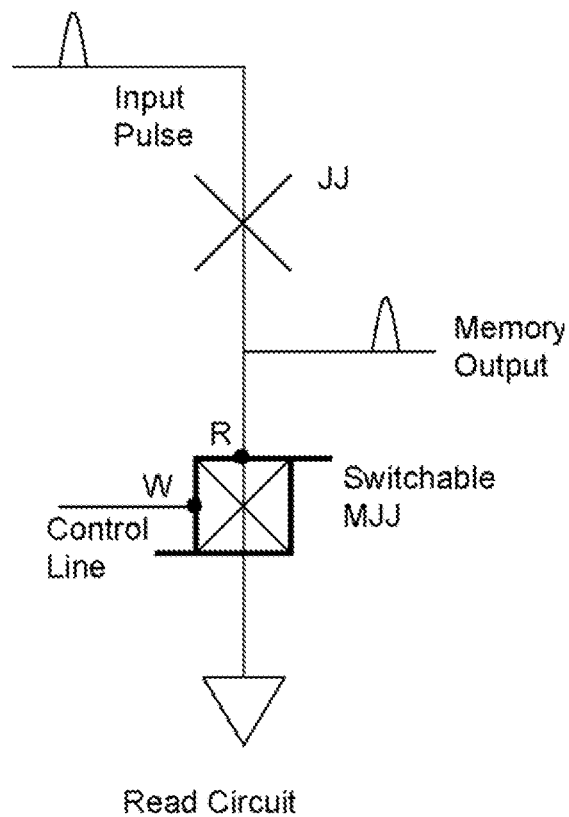
FIGS. 1A and 1B show simplified schematics of read and write circuits in an embodiment of the invention, having a switchable magnetic Josephson junction (MJJ)
Figure 1B:
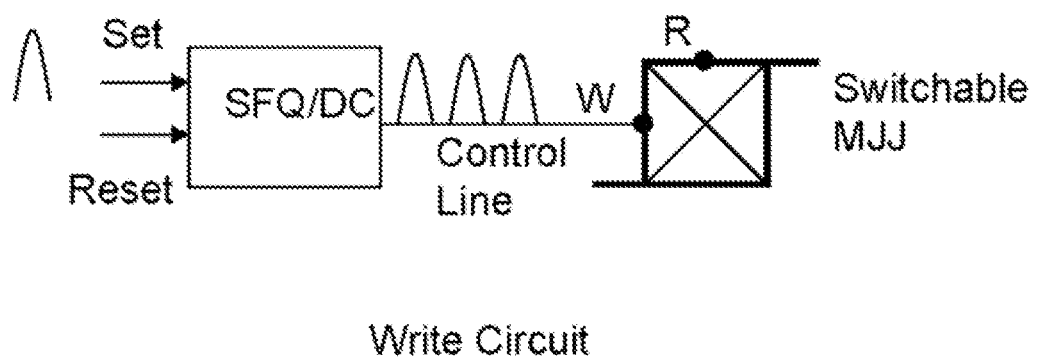

FIGS. 1A and 1B show simplified schematics of read and write circuits in an embodiment of the invention, having a switchable magnetic Josephson junction (MJJ). In these drawings, as in all other drawings of the disclosure an "X" sign signifies a standard JJ, while an "X" inside a square-like a square with its two diagonals indicates an MJJ. FIG. 1A shows in addition to the standard JJ port, which functions here as a read port, R, the switchable MJJ also has a write port, W, which enables Ic to be changed. Once the value of Ic is fixed, this MJJ acts just like a standard JJ, generating SFQ pulses in the standard manner. The herein discussed conceptualized read and write ports for changing the magnetization of the MJJ, are in general not to be confused with the read, write, input, output, ports of the memory cell.

Figure 2A:
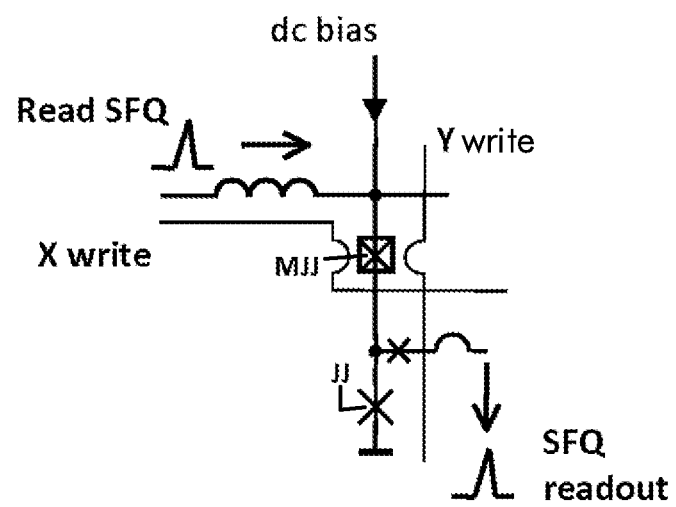
FIGS. 2A and 2B show a schematic circuit of an MJJ memory cell in an alternate embodiment of the invention with inductively coupled current write, and a generalized layout view with a magnetic flux transformer.

One may also combine JJs and MJJs in the same circuit. For example, one may adapt a standard JJ comparator comprising two Josephson junctions in series. If an input SFQ pulse enters on the top, in one mode of operation, either the JJ or the MJJ will switch, regenerating an SFQ pulse. In general, the junction with the lower value of Ic will switch. Therefore, if the MJJ has a critical current that is less than Ic0 of the JJ, there will be an SFQ pulse appearing on the output line. This corresponds to a binary state of "1", or true value, stored in the MJJ. On the other hand, if the MJJ has a critical current that is greater than Ic0 of the JJ, the JJ will switch, while the MJJ will not, and there will be no SFQ pulse on the output line. This corresponds to a binary state of "0" stored in the MJJ. It is understood, or course, that the binary assignment could be the other way around, with a pulse meaning "0" and the lack of a pulse meaning "1". If the MJJ is designed so that it can be repeatedly switched between a value of Ic less than Ic0 and one that is greater than Ic0, this forms a memory cell. One could use an MJJ as either the lower, or the upper junction. One can also switch the roles, and the assigned binary state values, of the two junctions. FIGS. 1A and 2A show differing embodiments in their detail of the MJJ-JJ comparator memory cell embodiment. The figures indicate only functional roles, they imply no structural features. For instance, the various JJs and MJJs may be connected by leads, as the figures show, or they may be fully integrated into multilayered structures, with shared layers between them.

FIG. 1B shows a generalized schematic of a write circuit for the MJJ. The switching of the magnetic state of the MJJ may be accomplished, for instance, by pulses, or by an integral of pulses, in a control line that change the magnetic flux in the magnetic barrier. Ideally, one would like to have a control signal from a single SFQ pulse which could switch the MJJ. While the amplitude of the SFQ pulse may be sufficiently large, the 1 ps timescale of an SFQ pulse may be too fast to produce the desired switching, i.e. the integral signal of the pulse may not be sufficient to change the MJJ magnetization. In this case, one may use a pulse circuit that is capable of generating a series of SFQ pulses that in their integrated effect are suitable for inducing the switch between states of magnetization of the MJJ. One example of such a pulse circuit may the known SFQ/Direct-Current (SFQ/DC) converter rapid SFQ (RFSQ) circuit. This SFQ/DC converter on receipt of an SFQ pulse in its SET input generates a time-series of SFQ pulses (corresponding to a dc average voltage output), until a second SFQ pulse turns it off. A pulse train of SFQ pulses, one that may last 100 ps, or even less, may be sufficient to switch the MJJ. Further amplification using superconducting or semiconducting devices may also be possible. An example of a suitable SFQ/DC circuit may be found, for instance at: http://pavel.physics.sunysb.edu/RSFQ/Lib/AR/sfqdc.html.

Figure 2B:
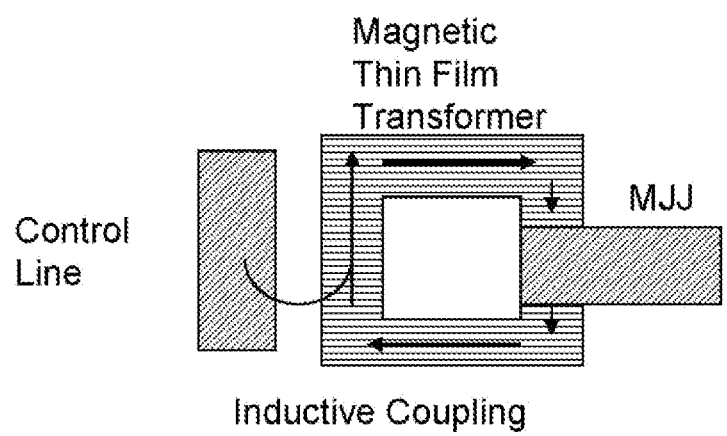

FIGS. 2A and 2B show a schematic circuit of an MJJ memory cell in an alternate embodiment of the invention with inductively coupled current write, and a generalized layout view with a magnetic flux transformer. FIG. 2A shows the schematic of the comparator based memory cell, having a MJJ and a JJ in series with a common dc bias current. The figure indicates inductively coupled X and Y-directional, perpendicular to each other write lines connecting to the MJJ. It is assumed that both the X and the y write lines have to be active for switching the magnetization of the MJJ. The reading of the cell, as in all embodiments of the instant disclosure, is done by an SFQ pulse applied to the comparator. In response to the read SFQ pulse, the MJJ, depending on its state of magnetization, may itself generate an SFQ pulse. As is known in the art, the SFQ pulse generated by the comparator, in the case of interest by the MJJ, can go to an SFQ readout stage through an output port that has a further blocking JJ, which JJ has one side connected to the comparator in-between the JJ and the MJJ. This blocking JJ may be necessary to prevent half-select problem in array configurations.

FIG. 2B shows a generalized write input port for the memory cell in the form of a ferromagnetic toroid. Such a magnetic thin film transformer permits one to use a control line, capable to carry a current, to influence the magnetization of the MJJ. The control line and the MJJ may be on different portions of the ring. A portion of the thin film transformer itself may actually be a ferromagnetic barrier layer of the MJJ. The different portions of the ring are magnetically strongly coupled to each other. This strong coupling may also minimize the leakage of stray magnetic field into nearby devices. The arrows in the thin film transformer ring symbolize the magnetization, and its directional vector. The magnetization of the ferromagnetic material in the barrier of the MJJ, also has a size and a directional vector, as well. One may influence either, or both, the direction and the magnitude of a stable magnetization. The magnetic field generated by a current in the control line influences the magnetization of the thin film transformer, and hence the Ic of the MJJ. FIG. 2B is only a generalized, conceptual, depiction. In an actual embodiment one may have more than one control line, as for instance FIG. 2A indicates 2 control lines, arranged to interact in a wide variety of manners with a transformer and an MJJ.

Figure 3A:
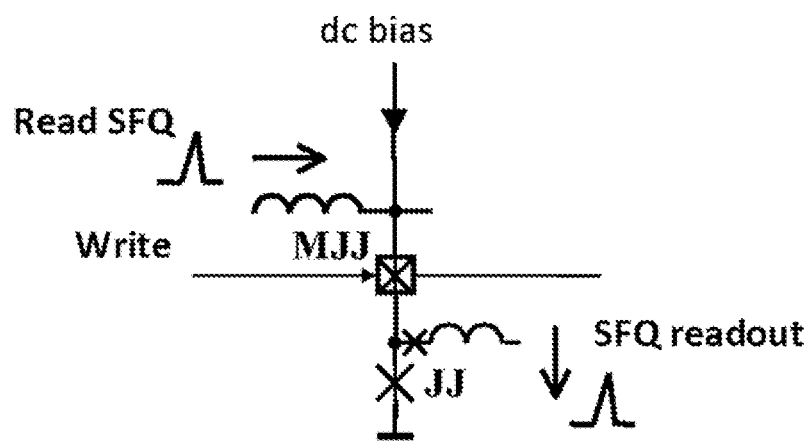
FIGS. 3A and 3B show a schematic circuit of an MJJ memory cell in an alternate embodiment of the invention with spin-current injection write, and a generalized layout view with a magnetic flux transformer.
Figure 3B:
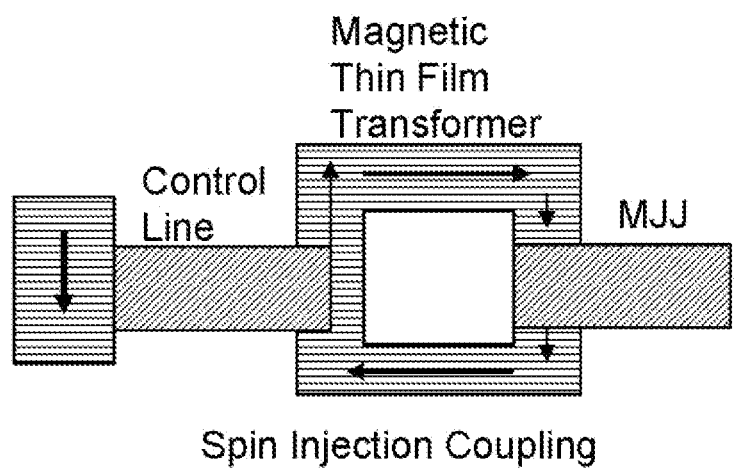

FIGS. 3A and 3B show a schematic circuit of an MJJ memory cell in an alternate embodiment of the invention with spin-current injection write, and a generalized layout view with a magnetic flux transformer. As FIG. 3A shows, the schematic and the operation, including the read portion, of the memory cell are essentially the same as with the already discussed differing write scheme embodiments. FIG. 3B depicts a generalized spin injection coupling write scheme. Spin injection works by carrying spin-polarized electrons from one magnetic material through the control line to another (provided that the length is sufficiently short that the spin-polarization does not relax), namely to the thin film transformer. In some cases spin-current injection write may provide faster switching with a smaller current than inductive coupling. While in the figures this horizontal thin film flux transformer layout is suggested for clarity, in some cases a vertical structure may be preferred, possibly somewhat similar to spin valve or spin torque transfer (STT) structures known in the art for non-superconducting magnetic devices.

As miniaturization progresses, junction areas will be ever smaller. It may happen that in a scaled MJJ the ferromagnetic material, which typically, but not necessarily, forms a ferromagnetic layer, has only a few, possibly only a single, magnetic domain. To decisively control the magnetization of such small junctions it may be useful to be able to rotate the barrier magnetization not only in the plane of the MJJ, but also in the plane perpendicular to it. One can define a horizontal plane, or the plane of the MJJ, as the plane which is parallel with its layer(s) of the barrier. Such rotation of the magnetization vector in the perpendicular plane, may be best accomplished by spin injection and with non-planar, or non-horizontal, transformers. In a high-density memory array applications line widths would be preferred to be ~1 μm or less.

Figure 4:
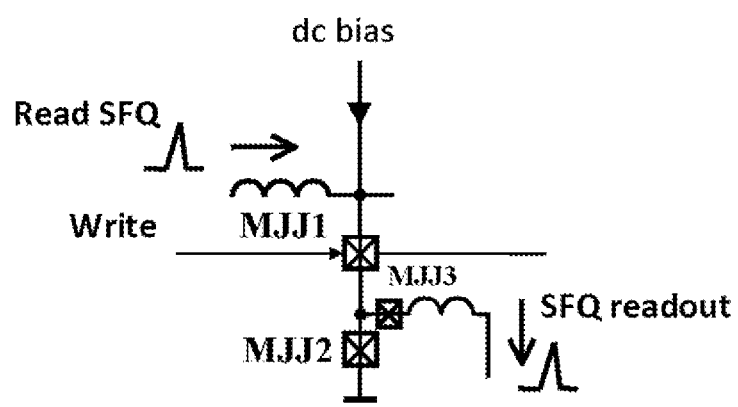
FIG. 4 shows a schematic circuit of an MJJ memory cell in an alternate embodiment of the invention, using only MJJs.

FIG. 4 shows a schematic circuit of an MJJ memory cell in an alternate embodiment of the invention, using only MJJs. As already discussed when the magnetization of an MJJ is not changed it is equivalent to a regular JJ. The figure shows that it is possible to have the junctions that do not necessarily require a switchable critical current, to be MJJs. The choice between using a MJJ-JJ cell or an all MJJ cell may come down to fabrication integration and circuit density issues. It may be that from the density point of view an MJJ-JJ memory cell is to be preferred since layers containing MJJ-s can be vertically integrated over the junctions in the JJ layer below.

MJJs are already known in the art. In one representative embodiment, a possible MJJ junction may have a composition of $Nb/Pd_{0.99}Fe0_{0.01}/Nb$. The given ratio of the PdFe material should not be interpreted as limitation, it is for illustrative purposes. Other materials besides the PdFe compositions are available, as well.

The preferred magnetic material for cryogenic applications may be one that is easily switched with a small control current at the temperature of operation. Materials optimized for room temperature are likely to have a value of the coercive field Hc, namely a sufficient applied magnetic field for switching the magnetic state of the junction, that becomes impractically large at cryogenic temperatures ~4° K. Conversely, a ferromagnetic material that is magnetically soft, i.e., it has low Hc at 4° K, may not even be a ferromagnet at room temperature. For example, an alloy of Pd with ~1% Fe has a Curie temperature only about 20-30° K, but this may be chosen in some embodiments for a 4° K device, since its value of Hc is in the range of a few Oe, maybe about 1 Oe (~100 A/m in SI units). In a switchable MJJ, the value of Ic, and the corresponding I-V characteristic, would be repeatedly switched back and forth between two different values, as controlled by an appropriate write pulse. The above discussion should not be read in a limiting fashion, other compositions of these materials, and other ferromagnetic materials may also be used for MJJ application.

Figure 5:
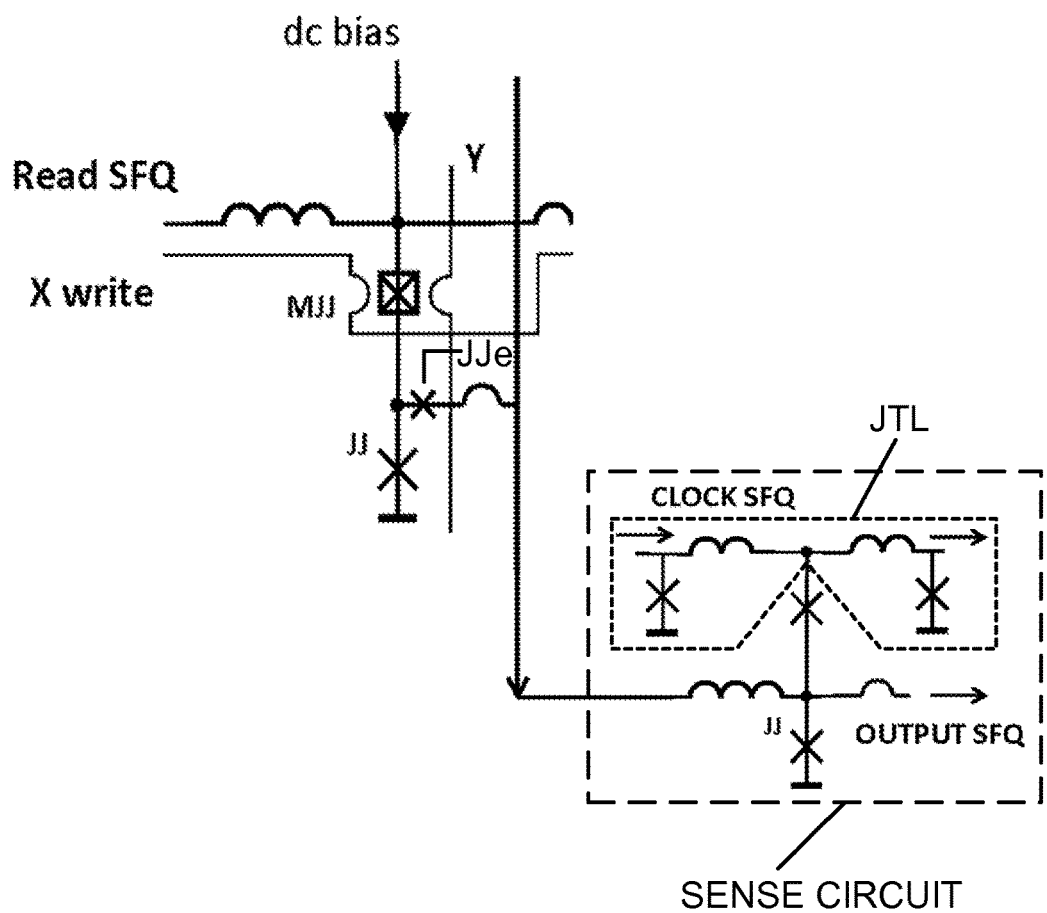
FIG. 5 shows schematically an MJJ memory cell with sensing circuit, one of the peripheral circuits for a memory cell array, in an embodiment of the invention.

FIG. 5 shows schematically an MJJ memory cell with sensing circuit, one of the peripheral circuits that a memory cell may need for being configured in a larger array. The sensing circuit is intended to detect a possibly weak readout signal coming from the cell output port, the output buffer junction JJe, onto the Y-directional sense line. This sense circuit (inside the dashed rectangle in the figure) has a two-junction balanced comparator, two JJs in series, which will be referred to as admitting comparator, and a standard Josephson transmission line (JTL) (inside the dotted shape within the sense circuit) carrying an SFQ clock pulse. The admitting comparator is connected to the clock JTL at an inductance midpoint of a JTL stage. The parameters in the sense circuit, inductors and JJ junction Ics, are chosen in such a way, that when the clock SFQ pulse enters the circuit loop including the admitting comparator, it sets a phase drop equal to π (180°) across the admitting comparator. The π phase drop is equivalent to a high input impedance state of the admitting comparator, which maximize its sensitivity. If one considers SFQ pulse propagation, an exact π phase drop across the admitting comparator means that the SFQ pulse propagating in the JTL and the one entering from the memory cell on the Y-directional sense line, arrive to the admitting comparator exactly at the same time. From operational point of view, if these two SFQ pulses substantially, meaning at least by about 30%, overlap in time at the comparator that is satisfactory for the operation of the sense circuit. The sense circuit clock may be integrated into a global clocking scheme, where it is correlated with the read SFQ pulse arriving to multiple memory cells, in possibly multiple memory blocks.

When a memory cell device is integrated into a memory array, there may be a need for further peripheral circuits, as well, for interfacing to logic circuits. Such are already generally available in the relevant arts. For instance, addressing may follow Kirichenko et al., in U.S. Pat. No. 7,443,719 "Superconducting circuit for high-speed lookup table" (2008), or "Pipelined dc powered SFQ RAM", IEEE Trans. Appl. Supercond., vol. 11, p. 537 (2001), or Yuh et al., "One-junction superconducting memory cell with column sense", IEEE Trans. Appl. Supercond., vol. 5, p. 3459 (1995), or Polonsky, et al., "Rapid Single Flux Quantum Random Access Memory", IEEE Trans. Appl. Supercond., vol. 5, p. 3000 (1995).

Figure 6:
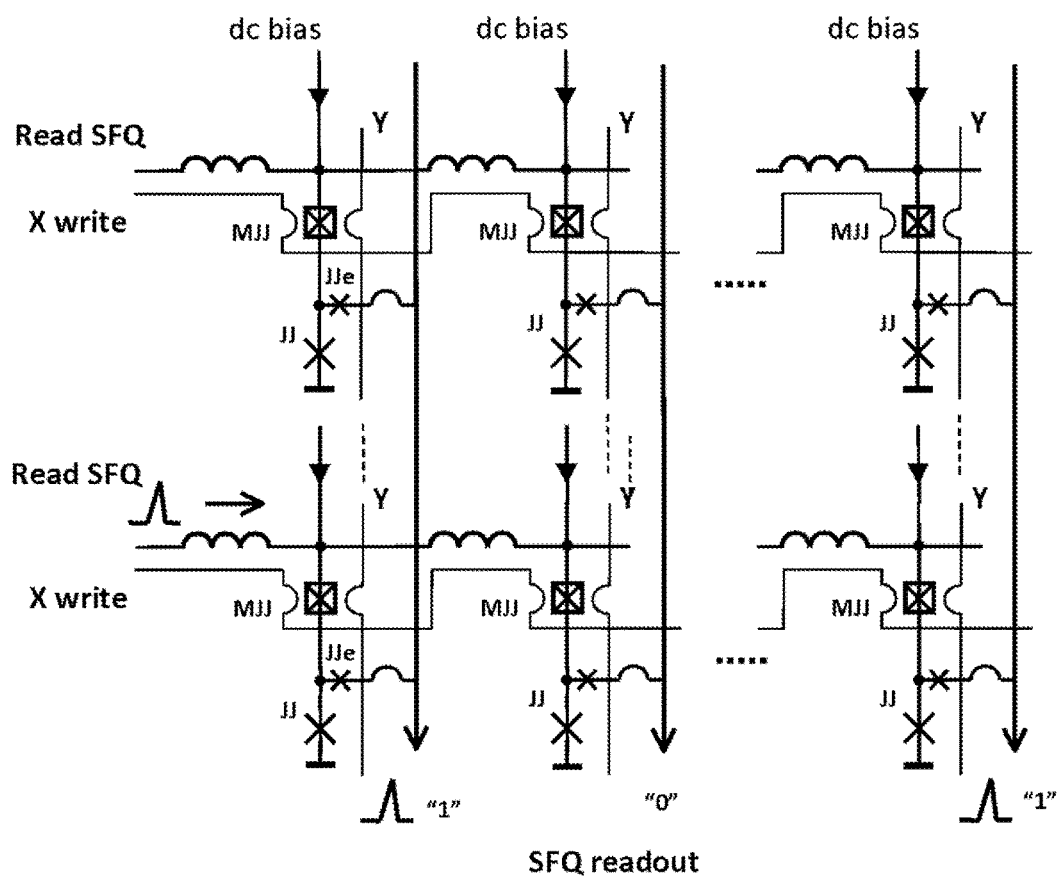
FIG. 6 shows schematically rows and columns of MJJ memory cells, forming a 2D array, in an X, Y addressable format.

FIG. 6 shows schematically rows and columns of MJJ based memory cells, forming a 2D array, in an X, Y addressable format. This superconducting memory array is arranged in X-directional rows and Y-directional columns. Each memory cell may be an MJJ-JJ comparator. Each memory cell has a write port for inducing a switch between the states of magnetization in the MJJ. In one of the states of its magnetization the MJJ generates an output SFQ pulse in response to a read SFQ pulse, which typically, but not necessarily is X-directional, word line type. The output of the cells goes to Y-directional output, or bit, lines, which may lead to sense circuits, for instance as shown in FIG. 5. The binary state of each the memory cell manifests itself as an output SFQ pulse being, or not being, generated by the MJJ, and propagated to the array outputs by bit lines.

X and Y-directional write lines, each pertaining to one of the rows and one of the columns respectively, couple to the write ports of the memory cells. A selected X-directional write line and a selected Y-directional write line in their combination are capable of inducing a switch between the states of magnetization in the memory cell that is located at their intersection. The figure schematically depicts an inductive write scheme such as that of FIGS. 2A and 2B, but any other type of write scheme may be applied as well.

Each memory cell has a read contact, or port, for interrogating the binary state of the MJJ, which read port can accept the read SFQ pulse. Furthermore, each memory cell has a bias current line. The bias current lines are typically arranged in the Y direction.

There is no obvious upper limit for the size of such a randomly accessible memory array (RAM). It is a question of general progress with fabrication techniques, and shrinking of line widths. For example, a 1 MB RAM, 1000 rows and columns each, in an area of 1 $cm^2$, when one includes array addressing, read, and write circuits, would entail that each memory cell be approximately about 5 μm apart for a two-dimensional array. Such density is already achievable. With finer lithography line width, each memory cells can be as small as tens of nanometers apart. It is understood that the memory array is not constrained to have equal number of rows and columns.

Figure 7:
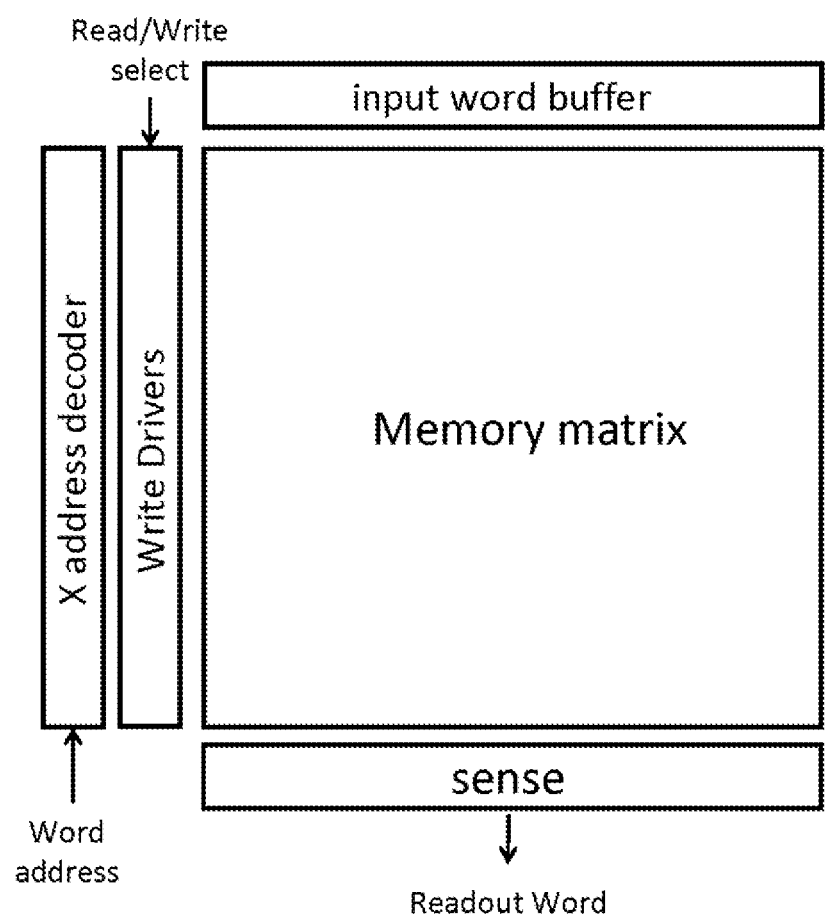
FIG. 7 shows block organization for word access in the 2D memory array.

FIG. 7 shows block organization for word access in the 2D memory array. Referring back to FIG. 6, each X-directional interrogating, or reading, bit line, transmitting an SFQ read pulse, connects to every memory cell of a row. Customarily the binary information in one row is referred to as a word. For a selected X-directional read line one word is read out because one applies no Y-directional read selection. All cells in the selected row are read out, and their content sent to sense through the Y-directional bit lines. A word address arrives to the memory array and it is decoded in the X address decoder, which selects which X-directional interrogating line should be activated. In each clock cycle one may also select whether a read or write operation is to be executed, thus a Read/Write select signal goes to the write drivers, whether they should be activated. While typically in a word address memory the reading is by rows, the writing is done by individual bits. Again referring back to FIG. 6, with X and Y write line selection each memory cell is individually selectable during a write cycle. During a read operation one may fill up the input word buffer with the next word to be stored in a memory row.

As depicted FIG. 7 may show only one word block in an even larger memory array, forming a plurality of such word blocks. A global clocking scheme may enable the pipelining of each of the word blocks, as it is known in art of memory organization. Accurate superconducting clocking for such purposes has already been disclosed, see U.S. patent application Ser. No. 12/973,661, by D. Kirichenko, filed Dec. 20, 2010.

Figure 8:
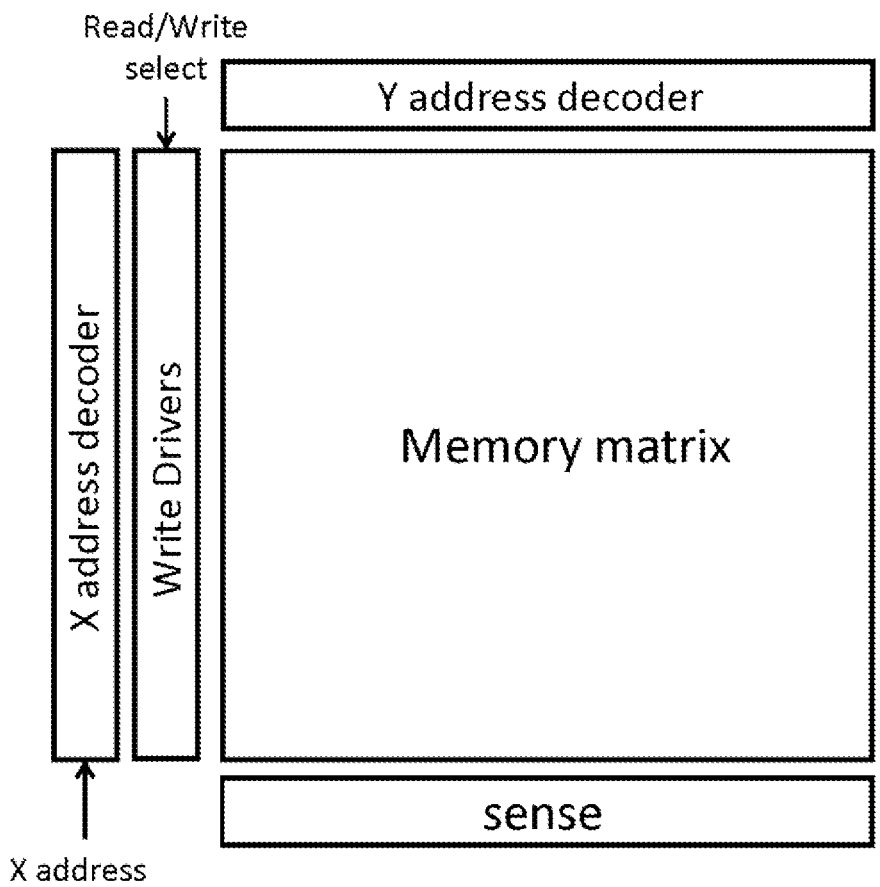
FIG. 8 shows block organization for bit access in the 2D memory array.

FIG. 8 shows block organization for bit access in the 2D memory array. When the need arises to read out individual memory cells in the memory array, one may use Y-directional selection with the bias current. Again referring back to FIG. 6, each individual cell has a bias current. The lines carrying the bias current can be organized into Y-directional bias current lines each one pertaining to one of the cell columns. A Y address decoder may select the desired column address. When an X-directional SFQ pulse is arriving on a X-selected interrogating line, only that single cell will respond that is in the Y-selected current biased column, and the intersection of the selected X read and Y current bias line. The read out bit, again in the form of a presence, or absence, of an SFQ pulse, will enter the sense circuit, and then appear on the output port of the whole memory array.

There may be practically no limit to the applicability of such superconducting memories based on MJJ cells. Without limiting intent, they may be used as Superconducting Ferromagnetic Random Access Memory (SF-RAM), various levels of cache memory, main memory, register files, look-up tables, memory controlled logic: similar to FPGAs (SF-PGAs or MPGAs), and various combinations of these.

Figure 9:
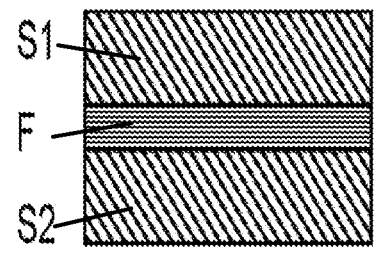
FIG. 9 shows cross sectional views of several variations of MJJ structures, for various embodiments of the invention.
Figure 9:
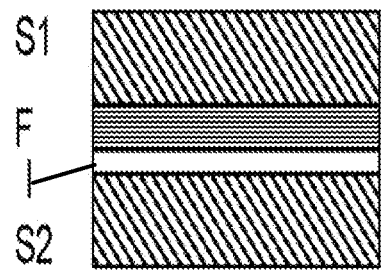
Figure 9:
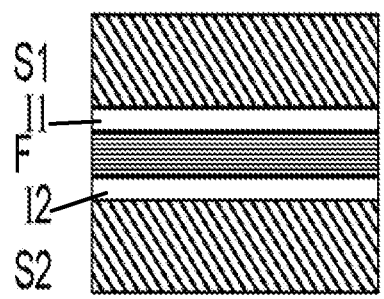
Figure 9:
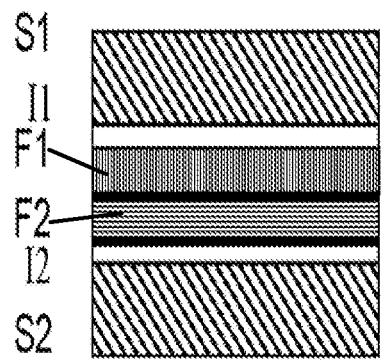

FIG. 9 shows cross sectional views of several variations of MJJ structures, for various embodiments of the invention, by way example without intent of limiting. This discussion addresses the structural, physical nature of the MJJs that may be suitable to apply in the disclosed circuit applications. In all cases, there are at least a pair of superconducting films with a barrier between them which includes a magnetic layer. The first structure is superconductor (S) S1, ferromagnetic (metallic) layer F, superconductor S2 (SFS) structure. However, since this is an all metallic structure, its driving resistance, impedance, may be smaller than desired. This driving impedance may be increased substantially by insertion of an insulating layer, I, similar to that of a conventional SIS junction, creating an SFIS structure, top right in FIG. 9. One could make this more symmetric with two insulating layers I1, I2, turning it into an SIFTS structure, bottom left on FIG. 9. Or use a compound F layer, with two components F1 and F2, which may be adjacent or separate, bottom right in FIG. 9. Furthermore, the barrier of an MJJ may not comprise any ferromagnetic magnetic layer, but may, for instance, have ferromagnetic particles embedded into a non-magnetic matrix.

The material making up the junction shown in FIG. 9 are generally known in the art. Without limiting, for illustration only, the superconducting layers may be Nb, the insulating layers various oxide nitrides, such as Si or Al oxides nitrides, and the ferromagnetic layer various usually dilute alloys of Fe, or Ni.

Figure 10:
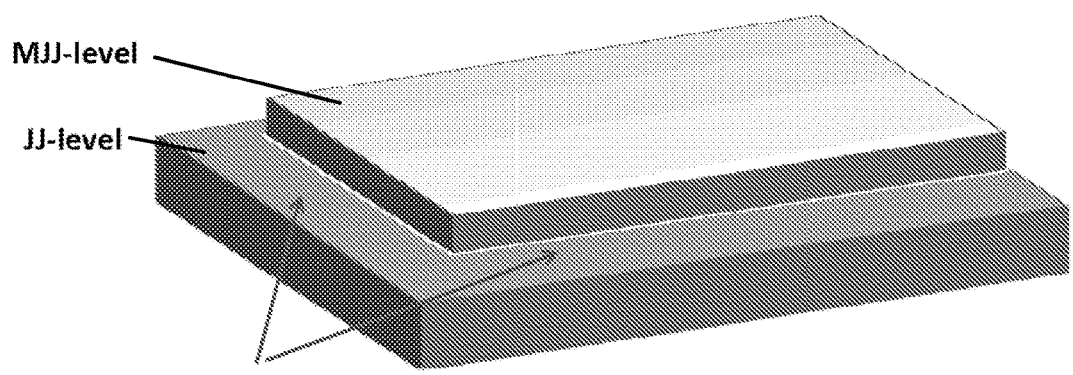
FIG. 10 shows a generalized layout of an MJJ memory array, with an MJJ level on top of a JJ level.

Remaining with structural considerations, FIG. 10 shows a generalized layout of an MJJ memory array, with an MJJ level on top of a JJ level. The "periphery circuits" all based on JJs would be located on the bottom. Such circuits may be the address decoders, sense circuits, MFQ (multi SFQ) write drivers, and energy efficient SFQ circuits (eSFQ) and ERSFQ logic designs, as described in O. Mukhanov, "Energy efficient SFQ technology", IEEE Transactions on Applied Superconductivity, vol. 21, pp. 760-769, (2011).

The multi-layer fabrication of superconducting logic circuits, up to computer processor complexity, based on JJs has already been demonstrated in the art. The FIG. 10 picture may refer to conventional JJ circuits and signal lines below, and a top set of layers associated with the MJJs. For example, this may be used for a cache memory, the MJJ level, lying on top but closely integrated with a microprocessor circuit, the JJ level. Such an arrangement would allow drastic reduction of processor/memory interconnects, leading to reduction of delays and power and to new architecture solutions such as distributed cache-register file structures. Such a 3D integration is also possible due to extremely low-power dissipation in the processor based on energy-efficient SFQ circuits (eSFQ or ERSFQ) and low-power MJJ based memory.

Figure 11:
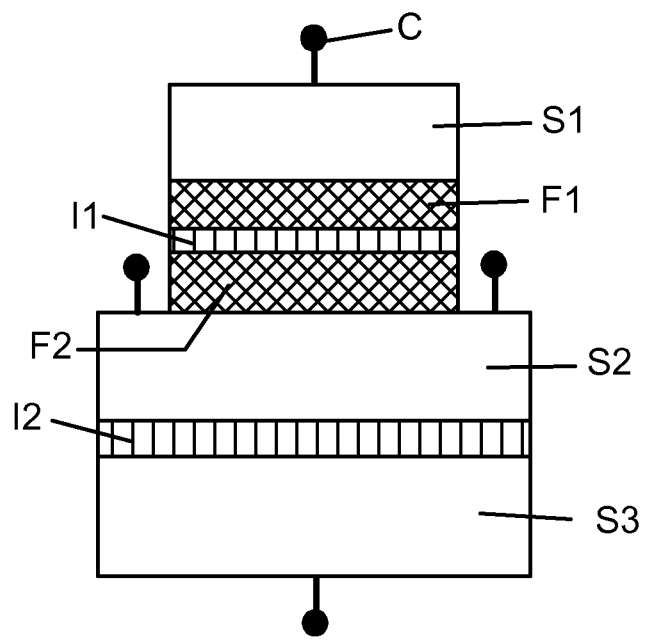
FIG. 11 shows schematic structural cross sections of a stacked double junction device.

The memory cells, and arrays disclosed in the instant application may be advantageously interfaced with as broad a range of superconducting devices as possible. It is further advantageous of having devices in the same ferromagnetic junction fabrication schemes as the memory arrays themselves. Embodiment of such a device, exhibiting gain, is discussed now. FIG. 11 shows a double-junction stacked structure containing two magnetic layers. In this case, without limiting, by way of example only, the superconductor may be Nb and the magnetic layers may be Ni, and the insulating layers may be AlOx. The device shown with the $S_1$, $F_1$, $I_1$, $F_2$, $S_2$, $I_2$, $S_3$ layers (SFIFSIS) structure, where I denotes insulating, S denotes superconducting, and F denotes magnetic non-superconducting metal layers, exhibits transistor-like properties. An electric signal applied to the SFIFS junction (input) is amplified in the SIS junction (output). The device presented in FIG. 11 has improved isolation between the input and output junctions compared to former designs known in the art. The novelty in the embodiment of the present disclosure lies in the use of two magnetic layers $F_1$, $F_2$ in the input junction, instead of one, or none. This SFIFSIS structure can be used as part of a memory cell having MJJ and SFIFSIS serially connected. The SFIFSIS structure will perform a role of readout device. Furthermore, if the SFIFS portion of the SFIFSIS structure supports the superconducting current, it can be used as a memory device itself, similar to the MJJ based on SFS and SFIS described above. In this case, the SFIFSIS structure constitutes a memory cell by itself.

The middle electrode in the device is a bilayer comprising of a superconductor $S_2$ in proximity with a ferromagnetic metal $F_2$. That is, both the $F_1$ and $F_2$ ferromagnetic metal layers in the device are adjacent to the injector tunnel barrier from both sides. In case if the SFIFSIS structure performs a role of readout device in a memory cell, the SFIFS part of it should not exhibit the superconducting current. This can be realized if the layers $F_1$ and $F_2$ are in the normal (non-superconducting) state while being in proximity with the superconducting layers $S_1$ and $S_2$, respectively. In turn this can be realized if their superconducting coherence lengths, $\xi_{F1}$ and $\xi_{F2}$, which determine the decay of the superconducting order parameter, are shorter than their respective thicknesses, $d_{F1}$ and $d_{F2}$. At the same time, the thickness of the $F_2$ layer has to be kept as small as possible (smaller than the quasiparticle energy diffusion length both in $F_2$ and in $S_2$, and smaller than the thickness of the $S_2$ layer that itself has to be as thin as possible in order to provide high concentration of the injected quasiparticles); the small thickness of the $F_2$ layer is necessary to reduce trapping in it of the quasiparticles injected into the $S_2/F_2$ bilayer from the injector junction. The majority of injected quasiparticles are transferred to the superconducting $S_2$ layer to create therein a non-equilibrium state with suppressed superconducting energy gap. On the other hand, the thickness of the $F_2$ layer has to be large enough to prevent direct tunneling from the $S_2$ layer to the $F_1S_1$ bilayer, which can be realized if the quasiparticle mean free path in the $F_2$ layer is short. The role of the $F_2$ layer is therefore to screen the manifestation of the energy gap of the superconducting layer $S_2$ in the I-V curve of the injector junction. Similarly, the role of the $F_1$ layer is therefore to screen the manifestation of the energy gap of the superconducting layer $S_1$ in the I-V curve of the injector junction. The $F_1$ layer may have the same properties as the $F_2$ layer (small thickness, short coherence length, and short mean free path), if it is in proximity with the superconducting $S_1$ layer, but the requirement of having small thickness can be relaxed. For fabrication reasons, this layer will have approximately the same thickness as the $F_2$ layer.

The technique for fabrication of Nb/Al multi-terminal devices comprising of two stacked tunnel junctions may include additional Ni layers. Ni cannot be etched by Reactive Ion Etching (RIE) using traditional reactive gases ($CF_4$ and $SF_6$). Appropriate treatment of the Ni layers using ion milling may be needed in the processing of the entire structure.

Figure 12:
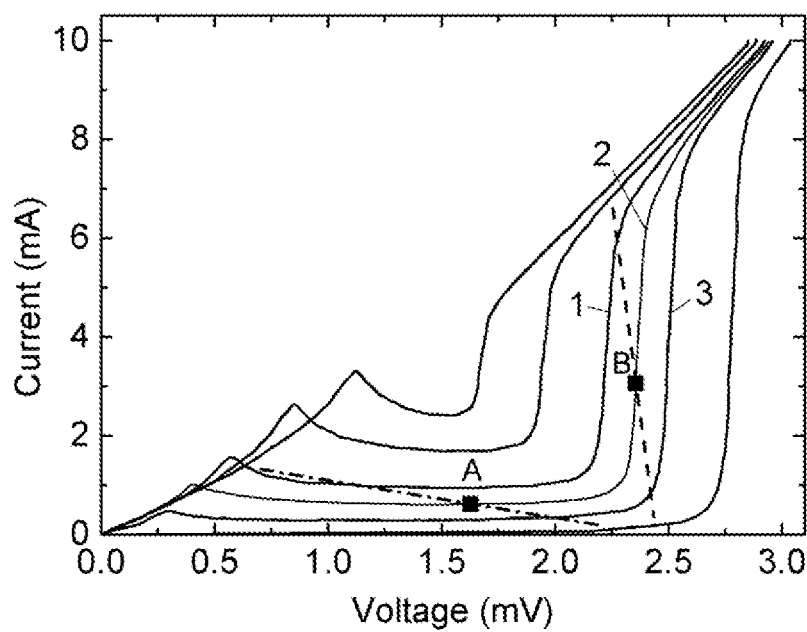
FIG. 12 shows output characteristics of a double junction device of FIG. 11.

The current-voltage characteristics of the acceptor ($S_2I_2S_3$) and the injector ($S_1F_1I_1F_2S_2$) junctions can be recorded using the electric contacts, C. The $S_2$ superconducting layer may have either one or two contacts (the configuration with two contacts is shown in FIG. 12), and the device can be tested by using one, in a three terminal configuration, or both, in a four terminal configuration. Properties of the $S_1F_1I_1F_2S_2I_2S_3$ device, made of the materials given as example earlier, allow for modulation of the acceptor $S_2I_2S_3$ junction I-V curve while feeding the current through the injector $S_1F_1I_1F_2S_2$ junction, due to physical mechanisms known in the art. On the other hand, feeding the Current through the acceptor $S_2I_2S_3$ junction will not modulate the I-V curve of the injector $S_1F_1I_1F_2S_2$ junction, meaning an isolation between the input and output terminals of the $S_1F_1I_1F_2S_2I_2S_3$ device. This property of the device is possible because, with the device design as described above, the I-V curve of the injector junction is linear according to the commonly known theory of tunneling in solids.

Indeed, according to their properties as described above, the $S_1F_1$ and $F_2S_2$ electrodes in the injector $S_1F_1I_1F_2S_2$ junction manifest themselves as normal (non-superconducting) electrodes, and therefore, the I-V curve of the injector junction can be described according to the formulae for tunneling between the normal metals as known in the arts:

$$I_{NN} = A|T|^2 \aleph_1(0) \aleph_2(0) \int_{-\infty}^{\infty} [f(E) - f[E + eV]] dE =$$
$$A|T|^2 \aleph_1(0) \aleph_2(0) eV \equiv G_{NN} V,$$

where A is a constant; T is the tunneling matrix element; $\aleph_1(0)$ and $\aleph_2(0)$ are electronic densities of states at the Fermi level of the $F_1$ and $F_2$ layers, respectively; f(E) is the Fermi distribution function; eV is the chemical potential difference between the $S_1F_1$ and $F_2S_2$ electrodes; and $G_{NN}$ is conductivity of the junction. It is clear from the above formulae that the injector junction has a linear I-V curve, and that this I-V curve is not affected by the quasiparticle injection from the acceptor junction in a reasonable approximation that the Fermi distribution functional form is preserved under the injection.

One may consider the properties of the non-superconducting materials $F_1$ and $F_2$ in a more detail. The coherence length in the ferromagnetic Ni layer can be expressed as $\xi_{Ni} = \sqrt{\hbar v_F l_{Ni}/6\pi k_B T_C}$, where $T_C$ is the Curie temperature, $T_C \sim 600$ K for Ni films. From resistivity measurements, with $\rho_{Ni} = 6.9$ $\mu\Omega$cm and the mean free path $l_{Ni} = 2.7$ nm in Ni at 300 K, one deduces $l_{Ni} = 3.2$ nm at 4.2 K. Using $v_F = 0.28 \times 10^8$ cm/s, one estimates the $\xi_{Ni}$ to be 0.7 nm. The penetration depth of the superconducting order parameter in the normal metal is $b_N \cong [\rho_N/\rho_S]\xi_N$, where $\rho_N$ and $\rho_S$ are the resistivities of the normal and superconducting layers, respectively, and $\xi_N$ is the coherence length of the normal layer. Applying this relation to the Ni layer, one obtains $b_{Ni} \cong 0.8$ nm; hence the I-V curve of the $Nb_{(1)}/Ni/AlO_x/Ni/Nb_{(2)}$ injector junction in the devices will not display any superconducting energy gap of the $Nb_{(1)}/Ni$ and $Ni/Nb_{(2)}$ bilayers, even if the thickness of the Ni layer, $d_{Ni}$, is considerably less than 7.5 nm. Therefore the I-V curve of the injector junction will be insensitive to the gap suppression in the $Nb_{(1)}$ and $Nb_{(2)}$ layers, the property that provides isolation in the device.

The isolation between the acceptor and the injector junctions can be characterized by the ratio of transresistances, $R_{m(a)}/R_{m(i)}$. The SFIFSIS device of FIG. 11 is expected to raise this ratio from around 10 with the available art, to 100 or above. This latter value is already in the realm of semiconductor bipolar transistors.

FIG. 12 shows a set of I-V characteristics of the double junction device of FIG. 11, under various levels of the injection current. Assuming that at a certain level of injection current, the I-V curve of the acceptor junction corresponds to curve 2, and a small RF signal is also applied across the injector junction, causing the acceptor I-V curve to oscillate between the curves 1 and 3. The working point of the acceptor junction can be chosen either in the subgap region (point A) or in the steep region of the I-V curve (point B). In the first case, the output of the acceptor is loaded by a high resistance (as schematically shown by dash-dot load line); in this regime, the voltage gain is maximal. In the second case, the load is matched to the dynamic resistance of the acceptor junction in the steep region. In this regime, the current and the power gain of the device is expected to be maximal. If the I-V curve of the acceptor junction bends backward due to self-injection, then the current and power gain will increase.

Such a SFIFSIS device could be used, for example, to provide gain and buffering between the write line of the magnetic memory cell and the RSFQ circuits. It also can be used for a sense line amplifier. It also can be used as a part of cryogenic non-superconducting STT-RAM cells (Spin Transfer Torque Random Access Memory) instead of an FET (field-effect transistor) to facilitate readout function.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

Many modifications and variations of the present invention are possible in light of the above teachings, and could be apparent for those skilled in the art. The scope of the invention is defined by the appended claims.

The invention claimed is:

1. A Josephson junction memory cell comprising:
at least one magnetic Josephson junction having at least one ferromagnetic barrier layer formed from a ferromagnetic material;
an output port; and
a write port configured to define a memory state of the Josephson junction memory cell having first and second memory states, the first state being associated with a generated single flux quantum (SFQ) pulse produced at the output port and the second state being associated with absence of a generated single flux quantum (SFQ) pulse at the output port.

2. The device of claim 1, further comprising a Josephson junction in series with the magnetic Josephson junction.

3. The device of claim 1, wherein the write port comprises an electrical contact in communication with the ferromagnetic material, further comprising a pulse circuit coupled to the electrical contact configured to generate a series of single flux quantum pulses which cause the Josephson junction memory cell to switch between states.

4. The device of claim 1, wherein the write port comprises a magnetic thin film transformer.

5. The device of claim 4, further comprising a magnetic material connected to the magnetic thin film transformer configured to inject spin polarized electrons to induce switching between the states.

6. A superconducting memory, comprising: an array of memory cells arranged in rows and columns;
each said memory cell comprising:
a comparator having a series of Josephson junctions, at least one of the Josephson junctions being a magnetic Josephson junction having a ferromagnetic material barrier supporting a first state and a second state of magnetization,
a write port for the magnetic Josephson junction configured to induce a change between the states of magnetization, and
an output port configured to selectively present a single flux quantum pulse corresponding to the first state and to selectively suppress a single flux quantum pulse corresponding to the second state;
a respective write line for each of the rows, coupled to the write port of each respective memory cell of the respective row; and
a respective write line for each of the columns, coupled to the write port of each respective memory cell of the respective column,
wherein a memory cell at the intersection of a selected row write line and a selected column write line is induced to switch between respective states of magnetization.

7. The superconducting memory of claim 6, further comprising:
an interrogation line for each of the rows, coupled to a read port of each respective memory cell of the respective row;
wherein each column has an associated column output line coupled to the respective output port for each memory cell in a respective column,
wherein each memory cell in response to a signal on the respective row interrogation line presents a signal corresponding to its respective state on the respective column output line.

8. The superconducting memory of claim 6, further comprising a global clock signal line configured to communicate a signal defining discrete clock periods.

9. The superconducting memory of claim 7, further comprising a sense circuit attached to each respective column output line to read a single flux quantum pulse propagating through the column output line.

10. The superconducting memory of claim 9, wherein said sense circuit comprises an admitting comparator and a Josephson transmission line capable of propagating a clock single flux quantum pulse, connected to an inductance midpoint of the Josephson transmission line, the clock single flux quantum pulse and the read single flux quantum pulse are so correlated to substantially overlap in time at the admitting comparator.

11. A superconducting ferromagnetic transistor comprising three superconducting electrodes configured into an injector junction and an acceptor junction, wherein at least the injector junction comprises at least one ferromagnetic thin layer and at least one insulating thin layer between two superconducting electrodes.

12. The superconducting ferromagnetic transistor of claim 11, wherein an electrical current in the injector junction modulates a voltage across the acceptor junction, while a current in the acceptor junction does not substantially modulate a voltage across the injector junction.

13. The superconducting ferromagnetic transistor of claim 11, wherein an electrical input to the injector junction comprises a constant bias and a small RF signal, and the corresponding output at the acceptor junction comprises an amplified RF signal which exhibits at least one of voltage gain, current gain, and power gain.

14. The superconducting ferromagnetic transistor of claim 11, wherein the transresistance of the acceptor junction is at least a factor of 100 greater than the transresistance of the injector junction.

15. The superconducting ferromagnetic transistor of claim 11, wherein at least one of the three superconducting electrodes is configured to interface with a cryogenic magnetic memory cell.

16. The superconducting ferromagnetic transistor of claim 11, wherein the at least three superconducting electrodes are fabricated as a stack of thin films having a sequence SFIF-SIS, where S represents a superconducting layer, F a ferromagnetic layer, and I an insulating layer.

17. The superconducting ferromagnetic transistor of claim 11, where the at least one ferromagnetic thin layer comprises Ni.

18. The superconducting ferromagnetic transistor of claim 11, where at least one of the superconducting electrodes comprises Nb.

19. The superconducting ferromagnetic transistor of claim 11, where the at least one insulating thin layer comprises AlOx.

20. The superconducting ferromagnetic transistor of claim 11, configured to interface to a Rapid Single Flux Quantum superconducting logic circuit.

* * * * *